United States Patent [19]

Dankert

[11] Patent Number: 5,370,906
[45] Date of Patent: Dec. 6, 1994

[54] WATERLESS PLANOGRAPHIC PLATES

[76] Inventor: Fred Dankert, RR3, Box 99, Oxford, N.Y. 13830

[21] Appl. No.: 144,364

[22] Filed: Nov. 2, 1993

[51] Int. Cl.$^5$ .......................... B05D 1/36; B05D 5/00
[52] U.S. Cl. ...................................... 427/261; 101/457; 101/462; 427/354; 430/303; 525/477; 525/479; 528/18; 528/32
[58] Field of Search ............... 101/453, 456, 457, 462; 427/261, 354; 430/302, 303; 525/477, 479; 528/18, 32

[56] References Cited

U.S. PATENT DOCUMENTS

| | | | |
|---|---|---|---|
| 3,910,187 | 10/1975 | Cords | 101/465 X |
| 4,010,687 | 3/1977 | Schanta et al. | 427/261 X |
| 4,016,814 | 4/1977 | Schanta et al. | 427/262 X |
| 4,019,437 | 4/1977 | Crystal | 101/401.1 X |
| 4,634,659 | 1/1987 | Esumi et al. | 101/465 X |

*Primary Examiner*—Michael Lusignan
*Attorney, Agent, or Firm*—Salzman & Levy

[57] ABSTRACT

The present invention features planographic plates fabricated with a silicone coating which produces economical and durable waterless plates when the coating is applied to imaged plates, cured and allowed to properly develop. Such a plate has a very high resolution and an excellent ink repellency in the non-print zones. The process of the invention applies the silicone coating directly onto a photo-imaged or a non-photo-imaged plate, curing the silicone, and then applying a solvent (developer) which penetrates through the silicone to the image. The imaging material is removed precisely, leaving a silicone stencil only in the desired, non-print areas. The silicone coating attaches chemically to the base metal (aluminum oxide), which produces a very durable coating.

25 Claims, No Drawings

WATERLESS PLANOGRAPHIC PLATES

FIELD OF THE INVENTION

The present invention pertains to planographic plates fabricated with a silicone coating which produces waterless plates, when the coating is applied to photographically or non-photographically imaged plates, cured and properly developed; and, more particularly, to a process that entails the application of a solvent, permeable, silicone coating directly onto an imaged plate; the curing of the silicone; and, then, the application of a solvent (developer) which penetrates through the silicone to the image. The imaging material is removed only from definite, precise areas, thus leaving a silicone stencil comprising the areas that are not to be printed.

BACKGROUND OF THE INVENTION

Waterless plates have been fabricated since 1970. Most current manufacturing procedures employ one or more of the following three imaging techniques:

1. A light-sensitive layer underlies the repellent silicone layer, remaining there after development in the exposed areas that become the non-image
2. The repellent silicone layer is directly attached to the support, with none of it removed in development; the image is made by attaching ink-receptive particles to the silicone, with these particles becoming the image
3. The repellent silicone layer is directly attached to the support, with none removed during development; the image is formed by altering the silicone layer by utilizing electrical discharge techniques There are many variations on the above techniques, as befitting this creative and imaginative art. In some cases, several other materials are introduced between the repellent silicone layer and the support.

The ability to produce a high-quality waterless planographic plate has heretofore proved elusive. One troublesome problem is that it is difficult for silicone coatings to adhere to organic materials. Therefore, when such materials underlay the silicone coating, poor adhesion results. Another critical situation is created when high heat over long cure cycles deteriorates organic materials, especially photosensitive ones. This makes heat post curing of the silicone layer difficult or even impossible. Another dilemma plaguing the industry is posed by the plates being easily degraded and destroyed. Still another deficiency of the existing plates is their inability to be imaged by any method other than photographic methods. This makes corrections difficult and the use of direct imaging (such as laser printing) impossible.

The present invention reflects the discovery that low, free-surface energy polymers chemically bonded to the substrate produce suitably repellent areas for the non-print zones of waterless plates. Dimethylpolysiloxanes have such properties. They can be made into tough, elastic films by catalytic reaction, after which they also possess certain reactive groups. For purposes of this invention, the film must be adherent to the developed non-print plate surface, usually aluminum oxide. Other metals (such as copper and steel) are also applicable, as are phenolic plastics and stone. The cured, low, free-surface energy polymers must also be sufficiently permeable to allow a developer to pass through to the image. In turn, the developer must be capable of producing a precise image. The word "precise" in this case indicates that the demarcation between the image areas and the non-print zones must be preserved exactly as they were on the original plate.

Dimethylpolysiloxanes with terminal hydroxyl sites are suitable prepolymers, but this inventor has found that they will only provide precise, well-adherent images when they are mixed and cross-linked with dimethylpolysiloxanes having certain other, reactive terminal groups. The reactive terminal groups allow for a strong cross-linking of the polymers, so that the development of the non-print areas will be exactly preserved. A chemical linkage occurs between the polymer silane groups and the metal oxide of the substrate, resulting in a very adherent film.

SUMMARY OF THE INVENTION

The invention features a waterless planographic plate and a method for making same. The imaged plate is coated with a low, free-surface energy polymer. Certain silicones having low surface energy have been found to be useful for this purpose. The surface energy is related to the surface tension, which is measured by determining the contact angles that typical fluids such as water, glycerine and methylene iodide make with respect to a silicone surface. The surface tension coefficients for the present invention are in the approximate range of between 10 to 12 dynes/cm for the non-image portions of the plate and in the approximate range of between 40 to 50 dynes/cm for the image areas of aluminum oxide plates. These surface coefficients compare very favorably with other known plates, such as the waterless plates manufactured by Toray, having a non-print area coefficient of 11 and an image area coefficient of about 37.

The silicone coating of this invention can be applied by hand or machine. The plate, which has been imaged, is coated and then heated to between 300° F. and 400° F. for a period of 30 seconds to 5 minutes in order to cure the applied silicone. The plate is then covered with a solvent (developer), which penetrates the silicone exactly where the silicone covers the image, but does not affect the silicone in the non-print areas.

The finished plate has excellent resistance to the hydrocarbon solvents that are commonly used in the trade as press and plate wash-up solvents. The Toray plate does not have such resistance. Optical resolution, as measured by a test target, is the equivalent of the Toray plate at approximately 30 lines/mm.

A further comparison of the current invention with the waterless Toray plate can be made with respect to durability and wear characteristics. The waterless plate of the present invention provides a much smoother plate surface with coefficients of static and kinetic friction of 0.39 and 0.38, respectively, as measured by rubber in contact with the coated aluminum plate. The frictional coefficients for a typical waterless Toray plate are 0.77 and 0.68, respectively. The smoother surface of Applicant's invention, however, enables there to be a reduction of both heat and wear during production runs. Consequently, the inventive plate is more durable. Running at lower temperatures subjects the inventive plate to less ink toning.

The image is released from the metal (metal oxide) base, along with the silicone that is disposed over the top thereof, leaving a silicone stencil in the non-print areas. The image comprises the bare metal/metal oxide.

The plate is then washed with water and dried. It is now ready to print, or, for greater durability, it may be post cured in an oven at 400°–500° F. for 5 to 10 minutes. The silicone coating forms a chemical bond with the metal oxide, producing a very adherent, durable coating.

The inventor has determined that the dimethylpolysiloxane siloxane silicone polymers have the desired properties required to produce repellent non-print areas on waterless plates. Such polymers can be made into tough, elastic films by catalytic reaction, after which they possess certain other, reactive groups. For purposes of this invention, the film must adhere to the developed, metal surface of the plate. Metals such as aluminum (oxide), copper and steel are applicable for this purpose, as are phenolic plastics and stone. The low, free-surface energy polymer must also be sufficiently permeable to allow the developer to pass through to the image. The image material must be precisely preserved. The word "precisely" in this case indicates that the demarcation between the image areas and the non-print zones must be maintained exactly as they were on the original plate. Dimethylpolysiloxanes with terminal hydroxyl sites are suitable prepolymers, but they are greatly improved for the purpose of this invention by being mixed and cross-linked, with dimethylpolysiloxanes containing terminal vinyl and/or acrylic groups. This polymer combination has an excellent adherence to a plate's non-print zones, while lending very good permeability to the developing solvent. Once the polymer combination is cured, the film is tough, elastic and resistant to both water and organic solvents.

The art of curing silicone polymers depends on a cross-linking compound which is caused to react with the polydimethylsiloxane-functional groups in the presence of a metal catalyst, usually a tin compound. The preferred cross-linker in this invention is a silicone-hydride functional silicone. The preferred catalysts are dibutyl tin diacetate and dibutyl tin dilaurate. An amino functional siloxane is employed as an accelerator.

Volatile organic acids are used for stabilizing the cross-linking and catalysis of the coating reaction. The stabilizer must have an acid number of at least 400.

Mineral spirits and/or cyclic silicone solvents are used to produce the correct coating viscosity.

One of the useful characteristics of the silicones used in this invention is the low rolling frictional surface. This low friction compares favorably with the known Toray waterless plates, which have surfaces of higher friction.

DESCRIPTION OF THE PREFERRED EMBODIMENT

Generally speaking, the invention pertains to an improved waterless planographic plate and the process for making same. An imaged litho plate is coated with silicone, which can be applied by hand or machine. The plate is heated to between 300° F. and 400° F. for a period of 30 seconds to 5 minutes to cure the silicone. The plate is then covered with a solvent (developer), which penetrates the silicone exactly where the silicone covers the image, but does not affect the silicone in the non-print areas. The image is released from the metal (metal oxide) base, along with the silicone coating, leaving a silicone stencil in the non-print areas. The image comprises the bare metal/metal oxide. The plate is then washed with water and dried. It is now ready to print, or, for greater durability, it may be post cured in an oven at 400°–500° F. for 5 to 10 minutes.

The substrate to which the silicone coating is applied must meet certain criteria for proper adhesion and development. The coating must adhere well enough to the non-image areas that development does not occur. The coating adheres well to the aluminum oxide found on conventional commercial litho plates and especially anodized or chemically oxidized aluminum. When being applied to iron, steel or copper, the surface must be clean and free of greasy materials. Iron, steel and copper (or their oxides) are satisfactory substrates. To use litho stones, one must pretreat the surface with a sodium silicate size. In order for phenolic plastic to be used, one must first treat the surface with an organic silicate size. The image must be temporarily affixed to the substrate (not affected by the silicone coating), and it must be soluble in the developing solvent.

Curing of the coating is accomplished with heat, either with an oven, a hot plate or a handheld heat gun. When using an oven, the time needed varies, depending upon actual heat output. Typical oven cure schedules are between two and five minutes from 300°–400° F.

Once the coating is cured, the developer is applied; it is chosen from a class of solvents of high-solvent parameter and of medium polarity. N-methyl-2-pyrrolidone and butyrolactone are typical examples thereof. These are particularly good developers because they do not damage the silicone in the non-print zones. They are easily washed away with the dissolved, original image material and silicone coating, because they are water-soluble. A water wash and a subsequent drying complete the plate fabrication process.

It is possible to produce or add to an image on the original plate with marking pens, paints and pencils, as long as the marking material is not affected by the coating and will dissolve in the developer. Many different marking materials can be employed. Corrections or handmade emendations are easily made to the original plate and will indeed print along with the original image. In a similar manner, deletions may also be made by removing portions of the original plate image with solvent. This makes the improved waterless plate especially useful for artists creating and producing their own original prints. It is also possible to use xerographic toner as the imaging material. This may be applied by hand (for artistic creation) or by xerographic machines, such as a laser printer.

This invention's unique advantage of a precoated plate lies in the user's ability to control permeability. Another advantage herein is that, even after development, this plate is still able to be further cured to an exceedingly adherent film with no loss in ink resistance. This is achieved by using a combination of low-temperature and high-temperature catalysts.

Deletions on the finished waterless plate can be made by applying some of the silicone coating to the image and heat-curing it with a heat gun. Additions on the finished waterless plate can be made by removing it with alkali (10% sodium hydroxide).

The general composition of this invention's litho plate coating is presented below:

| GENERAL COMPOSITION (All percentages are by weight) | |
|---|---|
| Percent % | |
| 5–25 | Hydroxyl methyl siloxane polymer |

-continued

| Percent % | GENERAL COMPOSITION (All percentages are by weight) |
|---|---|
| 2–12 | Vinyl and/or acrylic methyl siloxane polymer |
| 2–10 | Polysilane cross-linker |
| 1–4 | Amine functional siloxane accelerator |
| 2–8 | Metal catalyst |
| 4–10 | Acid stabilizer |
| 0–80 | Solvent - Mineral spirits and/or Decamethylcyclopentosiloxane and Octamethylcyclotetrasiloxane |

EXAMPLES

Example 1

A negative working additive litho plate (Cookson Graphics A109) was exposed to an ultraviolet printing lamp in the usual manner and developed with Western PN Red developer. A finisher was not used. After air-drying, the plate was coated with the following silicone coatings.

| Percent (%) | |
|---|---|
| 15.0 | Dow Corning Syloff 291 hydroxyl siloxane polymer |
| 7.0 | PPG Masil 2065 vinyl siloxane polymer |
| 4.0 | PPG Masil XL-1 cross-linker silicone hydride siloxane polymer |
| 1.0 | Dow Corning 2-7131 accelerator Dimethylaminoethoxysiloxane polymer |
| 4.0 | Dibutyltin diacetate |
| 7.0 | Ethyl butyric acid |
| 62.0 | Mineral spirits |

This was applied by hand and cured for 1½ minutes at 300° F. A second application of the coating was applied and cured for 1 minute at 300° F. When the plate was cool, Butyrolactone was poured thereon. A cotton wiping pad was rubbed gently onto the plate surface. The litho image and the silicone coating above it came off, but the non-print zones were unaffected. The plate was then washed with water in a sink and fan-dried. It was printed on a Rutherford proving press with waterless litho ink and produced an excellent resolution of the original film negative. The ink was washed off with mineral spirits and the press reinked. No loss of image or toning occurred. This washing and reinking sequence was repeated ten times. Again, no loss of image or toning occurred. Pot life of the silicone coating was 16 hours.

Example 2

A negative working subtractive litho plate (Cookson Graphics GC201) was exposed to ultraviolet light and developed with Cookson Graphics subtractive developer. No finisher was used. After air-drying, the plate was coated with silicone coating (as in EXAMPLE 1). The same curing and developing methods used in EXAMPLE 1 were also employed herein. The results were the same as in EXAMPLE 1.

Example 3

The same procedures used in EXAMPLES 1 and 2 were used herein, except that a positive working plate (Cookson Graphics Ultra) was employed. Again, the results were the same.

Example 4

Using any of the plates mentioned in EXAMPLES 1, 2 and 3; coating with the following silicone coating; and developing with Butyrolactone, the results were very similar.

| Percent (%) | |
|---|---|
| 15.0 | Dow Corning Syloff 291 hydroxyl siloxane polymer |
| 7.0 | Genesee Methacrylic functional siloxane polymer GP163 |
| 4.0 | PPG Masil XL-1 cross-linker |
| 1.0 | Dow Corning 2-7131 accelerator |
| 4.0 | Dibutyltin diacetate |
| 7.0 | Ethyl butyric acid |
| 62.0 | Mineral spirits |

Example 5

Using any of the plates mentioned in EXAMPLES 1, 2 and 3; coating with the following silicone coating; and developing with Butyrolactone, the results were very similar.

| Percent (%) | |
|---|---|
| 15.0 | Masil SFR 50,000 hydroxyl siloxane polymer |
| 7.0 | Masil SF201 vinyl siloxane polymer |
| 4.0 | PPG Masil XL-1 cross-linker |
| 1.0 | Dow Corning 2-7131 accelerator |
| 4.0 | Dibutyltin diacetate |
| 7.0 | Ethyl butyric acid |
| 62.0 | Mineral spirits |

Example 6

Using any of the plates mentioned in EXAMPLES 1, 2 and 3; coating with the following silicone coating; and developing with n-methyl 2 pyrrolidone, the results are similar. In this case, the pot life was improved from 16 to 24 hours.

| Percent (%) | |
|---|---|
| 15.0 | Masil SFR 750 hydroxyl siloxane polymer |
| 7.0 | Masil SF201 vinyl siloxane polymer |
| 4.0 | Masil XL-1 cross-linker |
| 1.0 | Dow Corning 2-7131 accelerator |
| 4.0 | Dibutyltin diacetate |
| 7.0 | Neoheptanoic acid |
| 62.0 | mineral spirits |

To facilitate commercial handing, the coating was divided into three components which, when combined in the ratio of A:B:C::2:1:1, produced the coating as described in EXAMPLE 6. In this way, the separate solutions had a shelf life in excess of one year. The formulas of these parts are as follows:

| Percent (%) | |
|---|---|
| | Part A |
| 30 | Masil 750 |
| 14 | Masil SF201 |
| 8 | Neoheptanoic acid |
| 48 | Mineral spirits |
| | Part B |
| 16 | Dibutyl tin diacetate |
| 12 | Neoheptanoic acid |

| Percent (%) | |
|---|---|
| 72 | Mineral spirits |
| | Part C |
| 16 | Masil XL-1 |
| 4 | Dow Corning 2-7131 |
| 80 | Mineral spirits |

Example 7

Conditions were the same as in EXAMPLE 6, except that dibutyl tin dilaurate is substituted for dibutyl tin diacetate. The dibutyl tin dilaurate is used with the same tin content level. The results were the same, except that the pot life is increased to 48 hours.

Example 8

Conditions were the same as those in EXAMPLE 6, except that di(n-octyl) tin S, S'-bis(isooctylmercaptoacetate) is substituted for dibutyl tin diacetate. The di(n-octyl) tin S, S'-bis(isooctylmercaptoacetate) is used with the same tin content level. The curing temperature was increased to 400° F. The results were the same, except that the pot life is increased to more than 10 days.

Example 9

Conditions were the same as those in EXAMPLE 7, except that Masil SF-MH (the same as in EXAMPLE 1, but with higher silicon hydride content) is substituted for Masil XL-1. The results are the same.

Example 10

Conditions were the same as in EXAMPLE 6, except that a positive working plate (Cookson Graphics Libra) was used. The results were the same.

Example 11

Conditions were the same as those in EXAMPLE 6, except that a copper-coated phenolic plastic was used as the substrate. After degreasing with xylol, imaging was achieved with artists' materials. After curing and development, the results were similar, but durability was not as good as when aluminum oxide was present in the substrate.

Example 12

Conditions were the same as those in EXAMPLE 11, except that a steel plate was used. Results were the same.

Example 13

Conditions were the same as those in EXAMPLE 11, except that a phenolic plastic (Garolite) sheet was used. In this case, an organic silicate size was applied before imaging. After curing and development, the results were the same.

Example 14

Conditions were the same as those in EXAMPLE 11, except that a lithographic stone was used. In this case, a 20% solution of sodium silicate was applied. The results were the same.

Example 15

Conditions were the same as those in EXAMPLE 6, except that an anodized aluminum plate was used, to which artists' materials were affixed in order to create the image. The materials were chosen so as to remain unmarred by an application of silicone coating, yet would still be soluble in the developer. After coating, curing and development, the results were the same.

Example 16

Conditions were the same as those in EXAMPLE 8, except that the coating solution was applied on a coater. (Thicker films can be obtained in this manner.) After being cured and developed in the same manner as before, the waterless plate is more durable and has greater ink resistance in non-print zones.

Example 17

Using the same plate and procedure as in EXAMPLE 6 (except with the following coating formula), the waterless plate is given (after completion) a 10-minute bake at 450° F. This produces a very tough and durable waterless plate. Durability is proven by erasure abrasion tests. No breakdown is noticed after 20 rubs. (Existing waterless plates break down after 10 rubs.)

| | |
|---|---|
| 15.0 | Masil SFR 750 hydroxyl siloxane polymer |
| 7.0 | Acrylic siloxane polymer |
| 4.0 | Masil XL-1 cross-linker |
| 1.0 | Dow Corning 2-7131 accelerator |
| 2.0 | Dibutyl tin diacetate |
| 2.0 | Di (n-octyl) tin S, S'-bis (isooctyl-mercaptoacetate) |
| 7.0 | Neoheptanoic acid |
| 62.0 | Decamethylcyclopentasiloxane |
| 100.0 | |

Example 18

Conditions were the same as in EXAMPLE 17, except that xerographic toner Xerox 9200/9400 was used as the imaging material. After being fixed with heat (as is the practice in laser printing), the plate was coated with the silicone coating and cured and developed in the same manner. Exact replication of the toner resulted, and other properties were the same.

Summary of Testing

Subsequent testing on other presses demonstrated that this invention produces a waterless plate equal to or better than present photographic plates on the market in the following areas governing quality: resolution, printability, lack of toning, fineness of details and durability. Post-curing produces greater durability than is available with existing waterless plates. This new invention is extremely versatile. A great variety of litho plates (e.g., subtractive, additive, positive, negative), as well as original drawings and laser printing or other non-photographic means, can be used for the image area of the plates. It is also possible to employ copper, steel and plastic, as well as lithographic stones. The new invention is easy to use, quick to make and very economical.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of fabricating a waterless planographic plate, comprising the steps of:
   a) directly coating low free-surface energy, permeable silicone prepolymers over an imaged plate to later form a tough durable coating, said tough durable coating having surface tension coefficient ranges of approximately between 40 to 50 dynes/cm for the image areas of aluminum oxide plates and approximately between 10 to 12 dynes/cm for the non-image areas;
   b) heating said coated plate to cure said permeable silicone prepolymers, creating polymers;
   c) applying a solvent image developer to said coated and cured plate, said solvent image developer being caused to penetrate said permeable silicone polymers where they come into contact with the image on said imaged planographic plate;
   d) releasing said image and coating portions of the polymers in contact with said image from said plate, forming a stencil thereupon; and
   e) washing and drying said plate.

2. The method in accordance with claim 1, further comprising the step of:
   f) post-curing said permeable silicone polymers disposed upon said plate.

3. The method in accordance with claim 1, wherein said permeable silicone polymers comprise cross-linked hydroxy-silicone compounds.

4. The method in accordance with claim 3, wherein said cross-linked hydroxy-silicone compounds are post-cured in an oven for approximately 5 to 10 minutes in a temperature range of approximately between 400°–500° F.

5. The method in accordance with claim 3, wherein said cross-linked hydroxy-silicone compounds are cured in accordance with step (b) for a time period of 30 seconds to 5 minutes in a temperature range of approximately between 300° F. and 400° F.

6. A method of fabricating a waterless planographic plate, comprising the steps of:
   a) coating cross-linked dimethylpolysiloxanes directly over an imaged plate;
   b) heating coated said planographic plate to cure said cross-linked dimethylpolysiloxanes;
   c) applying a solvent image developer to said planographic plate, said solvent image developer being caused to penetrate said cross-linked dimethylpolysiloxanes where they come into contact with the image on said imaged plate;
   d) releasing from said plate said image and portions of said cross-linked dimethylpolysiloxane-coating in contact with said image, forming a stencil upon said plate; and
   e) washing and drying said planographic plate.

7. The method in accordance with claim 6, further comprising the step of:
   f) post-curing said cross-linked dimethylpolysiloxanes disposed upon said planographic plate.

8. The method in accordance with claim 6, wherein said cross-linked dimethylpolysiloxanes comprise cross-linked hydroxysiloxanes.

9. The method in accordance with claim 8, wherein said cross-linked dimethylpolysiloxanes are post-cured in an oven for approximately 5 to 10 minutes in a temperature range of approximately between 400°–500° F.

10. The method in accordance with claim 8, wherein said cross-linked dimethylpolysiloxanes are cured in accordance with step (b) for a time period of 30 seconds to 5 minutes in a temperature range of approximately between 300° F. and 400° F.

11. The method in accordance with claim 6, wherein said cross-linked dimethylpolysiloxanes comprise hydroxyl and vinyl groups.

12. The method in accordance with claim 6, wherein said cross-linked dimethylpolysiloxanes comprise hydroxyl and acrylic groups.

13. The method in accordance with claim 6, wherein said cross-linked dimethylpolysiloxanes comprise hydroxyl, vinyl and acrylic groups.

14. A silicone, cross-linked, coating composition for a planographic plate, comprising in approximate weight percentage:

| Percent (%) | |
| --- | --- |
| 5–25 | Hydroxyl methyl siloxane polymer; |
| 2–12 | Vinyl methyl siloxane polymer; |
| 2–10 | Polysilane cross-linker; |
| 1–4 | Amine functional siloxane accelerator; |
| 2–8 | Metal catalyst; |
| 4–10 | Acid stabilizer; and |
| 0–80 | Solvent. |

15. A silicone, cross-linked, coating composition for a planographic plate, comprising in approximate weight percentage:

| Percent (%) | |
| --- | --- |
| 5–25 | Hydroxyl methyl siloxane polymer; |
| 2–12 | Acrylic methyl siloxane polymer; |
| 2–10 | Polysilane cross-linker; |
| 1–4 | Amine functional siloxane accelerator; |
| 2–8 | Metal catalyst; |
| 4–10 | Acid stabilizer; and |
| 0–80 | Solvent. |

16. A silicone, cross-linked, coating composition for a planographic plate, comprising in approximate weight percentage:

| Percent (%) | |
| --- | --- |
| 5–25 | Hydroxyl methyl siloxane polymer; |
| 2–12 | Vinyl and acrylic methyl siloxane polymers; |
| 2–10 | Polysilane cross-linker; |
| 1–4 | Amine functional siloxane accelerator; |
| 2–8 | Metal catalyst; |
| 4–10 | Acid stabilizer; and |
| 0–80 | Solvent. |

17. The silicone, cross-linked, coating composition for a planographic plate, in accordance with claims 14, 15 or 16, wherein said polysilane cross-linker comprises a silicone-hydride functional silicone.

18. The silicone, cross-linked, coating composition for a planographic plate, in accordance with claims 14, 15 or 16, wherein said metal catalyst comprises dibutyl tin diacetate.

19. The silicone, cross-linked, coating composition for a planographic plate, in accordance with claims 14, 15 or 16, wherein said metal catalyst comprises dibutyl tin dilaurate.

20. The silicone, cross-linked, coating composition for a planographic plate, in accordance with claims 14, 15 or 16, wherein said solvent comprises mineral spirits or Decamethylcyclopentosiloxane and Octamethylcyclotetrasiloxane.

21. The silicone, cross-linked, coating composition for a planographic plate, in accordance with claims 14, 15 or 16, in combination with a developer solvent comprising N-methyl-2-pyrrolidone.

22. The silicone, cross-linked, coating composition for a planographic plate, in accordance with claims 14, 15 or 16, in combination with a developer solvent comprising Butyrolactone.

23. The silicone, cross-linked, coating composition for a planographic plate, in accordance with claims 14, 15 or 16, wherein said acid stabilizer comprises ethyl butyric acid.

24. The silicone, cross-linked, coating composition for a planographic plate, in accordance with claims 14, 15 or 16, wherein said acid stabilizer comprises neoheptanoic acid.

25. The silicone, cross-linked, coating composition for a planographic plate, in accordance with claims 14, 15 or 16, wherein said solvent comprises mineral spirits and Decamethylcyclopentosiloxane and Octamethylcyclotetrasiloxane.

* * * * *